US011914307B2

(12) United States Patent
Roset et al.

(10) Patent No.: US 11,914,307 B2
(45) Date of Patent: Feb. 27, 2024

(54) INSPECTION APPARATUS LITHOGRAPHIC APPARATUS MEASUREMENT METHOD (71) Applicant: ASML Netherlands B.V., Veldhoven (NL)

(72) Inventors: Bas Johannes Petrus Roset, Eindhoven (NL); Johannes Hendrik Everhardus Aldegonda Muijderman, Veldhoven (NL); Benjamin Cunnegonda Henricus Smeets, Weert (NL)

(73) Assignee: ASML Netherlands B.V., Veldhoven (NL)

( * ) Notice: Subject to any disclaimer, the term of this patent is extended or adjusted under 35 U.S.C. 154(b) by 21 days.

(21) Appl. No.: 17/433,897

(22) PCT Filed: Jan. 28, 2020

(86) PCT No.: PCT/EP2020/051998
§ 371 (c)(1),
(2) Date: Aug. 25, 2021

(87) PCT Pub. No.: WO2020/173641
PCT Pub. Date: Sep. 3, 2020

(65) Prior Publication Data
US 2022/0187719 A1 Jun. 16, 2022

(30) Foreign Application Priority Data
Feb. 26, 2019 (EP) ..................... 19159362

(51) Int. Cl.
*G03F 7/00* (2006.01)
*G03F 9/00* (2006.01)

(52) U.S. Cl.
CPC ...... *G03F 7/70725* (2013.01); *G03F 7/70483* (2013.01); *G03F 7/70653* (2023.05); *G03F 7/706835* (2023.05); *G03F 9/7034* (2013.01)

(58) Field of Classification Search
CPC ............. G03F 7/70725; G03F 7/70775; G03F 7/70483–70541; G03F 7/70608–70683;
(Continued)

(56) References Cited

U.S. PATENT DOCUMENTS 6,020,964 A 2/2000 Loopstra et al.
6,952,253 B2 10/2005 Lof et al.
(Continued)

FOREIGN PATENT DOCUMENTS

CN 101320223 B 3/2011
CN 104236407 A 12/2014
(Continued)

OTHER PUBLICATIONS

International Search Report and Written Opinion of the International Searching Authority directed to related International Patent Application No. PCT/EP2020/051998, dated May 6, 2020; 9 pages.
(Continued)

*Primary Examiner* — Christina A Riddle
(74) *Attorney, Agent, or Firm* — Sterne, Kessler, Goldstein & Fox P.L.L.C.

(57) ABSTRACT

The invention provides an inspection apparatus for inspecting an object, the apparatus comprising: a measurement system configured to measure: —a first parameter of the object across an area of interest of the object, and —a second parameter, different from the first parameter, of the object at a plurality of locations on the object; a stage apparatus configured to position the object relative to the measurement system during a measurement of the first parameter, wherein the measurement system is configured to measure the second parameter at the plurality of different locations during the measurement of the first parameter and wherein the stage
(Continued)

apparatus is configured to position the object relative to the measurement system based on a compliance characteristic of the stage apparatus.

21 Claims, 6 Drawing Sheets (58) Field of Classification Search
CPC ............ G03F 7/70716; G03F 7/70733; G03F
7/70758; G03F 7/70766; G03F 7/70783;
G03F 7/708; G03F 7/70808; G03F
7/7085; G03F 7/70858; G03F 7/709;
G03F 7/70975; G03F 7/70991; G03F
9/70; G03F 9/7003; G03F 9/7007; G03F
9/7019; G03F 9/7023; G03F 9/7088;
G03F 9/7092; G03F 9/7096; G03F
9/7026; G03F 9/7034; G03F 7/705; G03F
7/70605–706851
USPC .................................. 355/30, 52–55, 67–77
See application file for complete search history.

(56) References Cited

U.S. PATENT DOCUMENTS

| | | | |
|---|---|---|---|
| 7,710,540 | B2 | 5/2010 | Loopstra et al. |
| 8,279,401 | B2 | 10/2012 | Vervoordeldonk et al. |
| 9,696,635 | B2 | 7/2017 | Engelen et al. |
| 2001/0016938 | A1 | 8/2001 | Nishiyama et al. |
| 2007/0058173 | A1 | 3/2007 | Holzapfel |
| 2009/0009738 | A1* | 1/2009 | Sasaki .................. G03F 9/7026 356/399 |
| 2009/0123874 | A1* | 5/2009 | Nagayama ............ G03F 9/7096 430/311 |
| 2009/0208855 | A1* | 8/2009 | Koga .................... G03F 9/7003 430/30 |
| 2011/0026004 | A1* | 2/2011 | Van Eijk ............. G03F 7/70783 355/72 |
| 2012/0212749 | A1* | 8/2012 | Den Boef .............. G01B 11/00 356/615 |
| 2014/0340661 | A1* | 11/2014 | Sato .................... G03F 7/70633 430/325 |
| 2015/0185625 | A1 | 7/2015 | Chen et al. |
| 2017/0212431 | A1 | 7/2017 | Van De Wal et al. |

FOREIGN PATENT DOCUMENTS

| | | |
|---|---|---|
| TW | 2012-45900 A | 11/2012 |
| WO | WO 2015/185301 A1 | 12/2015 |
| WO | WO 2016/041741 A2 | 3/2016 |
| WO | WO 2019/162280 A1 | 8/2019 |

OTHER PUBLICATIONS

International Preliminary Report on Patentability directed to related International Patent Application No. PCT/EP2020/051998, dated Aug. 25, 2021; 7 pages.

Butler, Hans, "Position Control in Lithographic Equipment," IEEE Control Systems Magazine, vol. 31, No. 5, Oct. 1, 2011; pp. 28-47.

Japanese Notice of Reasons for Refusal with English-language translation directed to related Japanese Patent Application No. 2021-545703, dated Aug. 26, 2022; 8 pages.

* cited by examiner

INSPECTION APPARATUS LITHOGRAPHIC APPARATUS MEASUREMENT METHOD

CROSS-REFERENCE TO RELATED APPLICATION

The application claims priority of EP application 19159362.3 which was filed on Feb. 26, 2019 which is incorporated herein in its entirely by reference.

FIELD

The present invention relates to the field of lithography, in particular to the field of measuring characteristics of a semiconductor substrate in preparation of an exposure process as performed by a lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

Typically, the manufacturing process of a semiconductor circuit requires the accurate patterning of a plurality of different layers onto a semiconductor substrate. In order to ensure proper operation of the semiconductor circuit, it is required that the sequence of layers is properly aligned. In order to achieve this, a substrate may be provided with a plurality of markers, e.g. referred to as alignment markers. A position of these marks is typically determined prior to the projection of a patterned radiation beam, and used to properly position the patterned radiation beam.

An accurate patterning of a semiconductor substrate also requires that the surface of the substrate onto which the patterned beam is projected is kept substantially in a focal plane of the patterned radiation beam, so as to obtain an accurate patterning. In order to achieve this, a height profile of the substrate may be determined prior to the projection of the patterned radiation beam. Said height profile may subsequently be used to control a position of the substrate during the projection of the patterned radiation beam.

As the demand for smaller and more complex semiconductor circuits is ever increasing, there is also an increasing demand for information regarding the substrate that is to be patterned. In particular, there is an increasing demand to determine more alignment mark positions, in order to enable a more accurate projection of the patterned radiation beam.

In addition, there is an ever increasing demand to increase the throughput of lithographic apparatuses, i.e. the number of substrates processed per unit of time.

Due to the increasing demand for information, the time required for obtaining this information, e.g. a height profile of the substrate and a position of a plurality of alignment marks, tends to increase to such degree that the throughput of the apparatus may reduce, rather than increase.

SUMMARY

It is an objective of the present invention, to provide an apparatus that enables to obtain required information on the state of an object such as a substrate in a more time efficient manner.

According to a first aspect of the invention, there is provided an inspection apparatus for inspecting an object comprising:
 a measurement system configured to measure:
  a first parameter of the object across an area of interest of the object, and
  a second parameter, different from the first parameter, of the object at a plurality of locations on the object;
 a stage apparatus configured to position the object relative to the measurement system during a measurement of the first parameter, wherein
 the measurement system is configured to measure the second parameter at the plurality of different locations during the measurement of the first parameter and wherein
 the stage apparatus is configured to position the object relative to the measurement system based on a compliance characteristic of the stage apparatus.

The inspection apparatus according to the invention enables to perform a combined measurement sequence of a first parameter and a second parameter of an object, whereby, during a measurement of the first parameter, the object is positioned relative to the measurement system, while taking account of a compliance characteristic of the stage apparatus that positions the object. By taking account of the compliance characteristic, the measurement sequence may be performed faster and may be more accurate.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
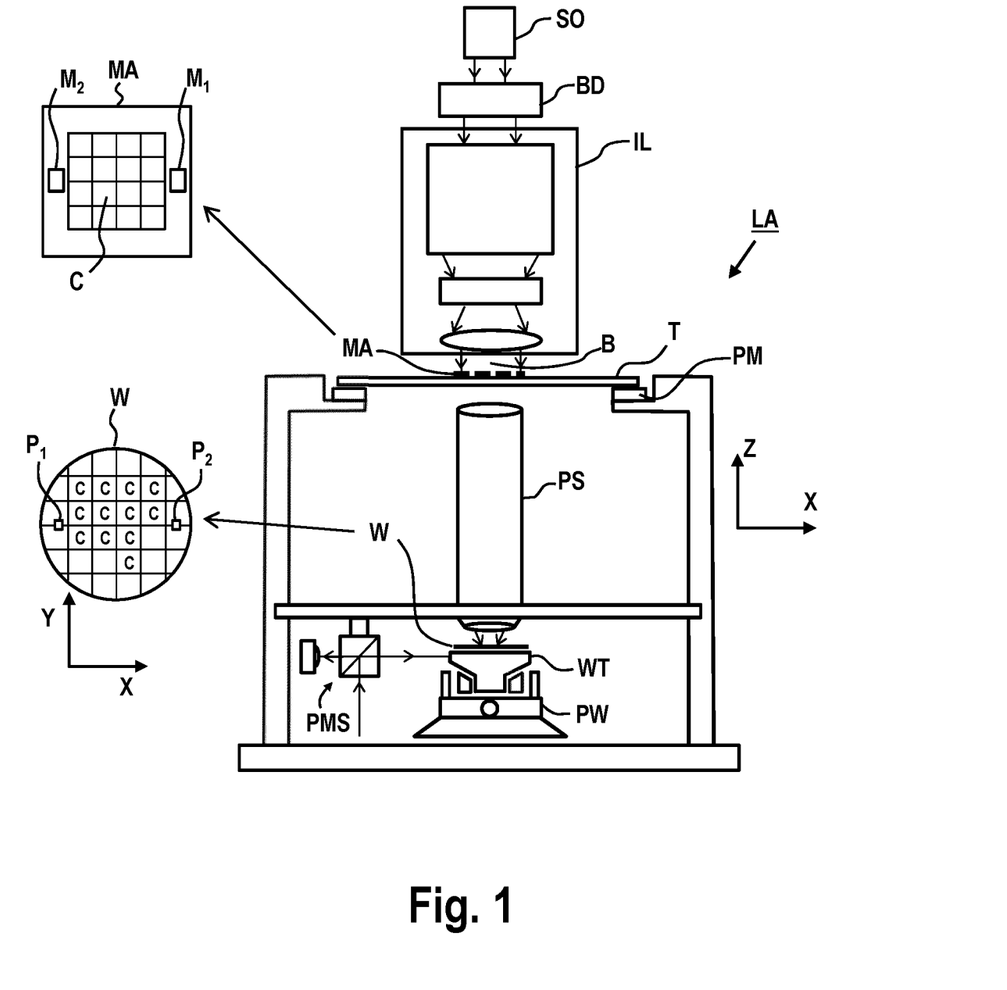
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W. Such a dual stage lithographic apparatus may e.g. be equipped with an inspection apparatus according to the present invention, whereby the measurement system of the inspection apparatus is configured to perform, in preparation of an exposure process, a measurement process on a substrate, said measurement process e.g. involving determining a height profile of the substrate and determining a position of a plurality of marks that are present on the substrate. In such embodiment, the stage apparatus of the inspection apparatus according to the invention may thus be embodied as a substrate support WT. In an embodiment, the positioning device as applied in the inspection apparatus according to the invention may be embodied in a similar manner as the second positioner PW, e.g. as described below. In particular, the positioning device as applied may comprise a long-stroke module and a short-stroke module.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Figure 2:
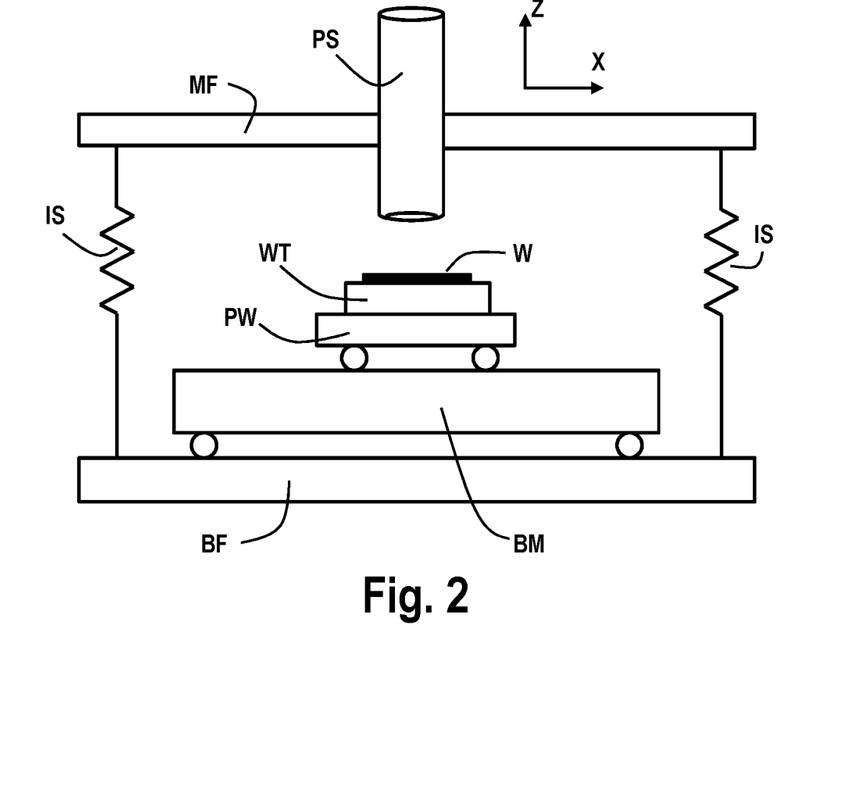
FIG. 2 depicts a detailed view of a part of the lithographic apparatus of FIG. 1.

FIG. 2 shows a more detailed view of a part of the lithographic apparatus LA of FIG. 1. The lithographic apparatus LA may be provided with a base frame BF, a balance mass BM, a metrology frame MF and a vibration isolation system IS. The metrology frame MF supports the projection system PS. Additionally, the metrology frame MF may support a part of the position measurement system PMS. The metrology frame MF is supported by the base frame BF via the vibration isolation system IS. The vibration isolation system IS is arranged to prevent or reduce vibrations from propagating from the base frame BF to the metrology frame MF.

The second positioner PW is arranged to accelerate the substrate support WT by providing a driving force between the substrate support WT and the balance mass BM. The driving force accelerates the substrate support WT in a desired direction. Due to the conservation of momentum, the driving force is also applied to the balance mass BM with equal magnitude, but at a direction opposite to the desired direction. Typically, the mass of the balance mass BM is significantly larger than the masses of the moving part of the second positioner PW and the substrate support WT.

In an embodiment, the second positioner PW is supported by the balance mass BM. For example, wherein the second positioner PW comprises a planar motor to levitate the substrate support WT above the balance mass BM. In another embodiment, the second positioner PW is supported by the base frame BF. For example, wherein the second positioner PW comprises a linear motor and wherein the second positioner PW comprises a bearing, like a gas bearing, to levitate the substrate support WT above the base frame BF.

The position measurement system PMS may comprise any type of sensor that is suitable to determine a position of the substrate support WT. The position measurement system PMS may comprise any type of sensor that is suitable to determine a position of the mask support MT. The sensor may be an optical sensor such as an interferometer or an encoder. The position measurement system PMS may comprise a combined system of an interferometer and an encoder. The sensor may be another type of sensor, such as a magnetic sensor, a capacitive sensor or an inductive sensor. The position measurement system PMS may determine the position relative to a reference, for example the metrology frame MF or the projection system PS. The position measurement system PMS may determine the position of the substrate table WT and/or the mask support MT by measuring the position or by measuring a time derivative of the position, such as velocity or acceleration.

The position measurement system PMS may comprise an encoder system. An encoder system is known from for example, United States patent application US2007/0058173A1, filed on Sep. 7, 2006, hereby incorporated by reference. The encoder system comprises an encoder head, a grating and a sensor. The encoder system may receive a primary radiation beam and a secondary radiation beam. Both the primary radiation beam as well as the secondary radiation beam originate from the same radiation beam, i.e., the original radiation beam. At least one of the primary radiation beam and the secondary radiation beam is created by diffracting the original radiation beam with the grating. If both the primary radiation beam and the secondary radiation beam are created by diffracting the original radiation beam with the grating, the primary radiation beam needs to have a different diffraction order than the secondary radiation beam. Different diffraction orders are, for example, $+1^{st}$ order, $-1^{st}$ order, $+2^{nd}$ order and $-2^{nd}$ order. The encoder system optically combines the primary radiation beam and the secondary radiation beam into a combined radiation beam. A sensor in the encoder head determines a phase or phase difference of the combined radiation beam. The sensor generates a signal based on the phase or phase difference. The signal is representative of a position of the encoder head relative to the grating. One of the encoder head and the grating may be arranged on the substrate structure WT. The other of the encoder head and the grating may be arranged on the metrology frame MF or the base frame BF. For example, a plurality of encoder heads are arranged on the metrology frame MF, whereas a grating is arranged on a top surface of the substrate support WT. In another example, a grating is arranged on a bottom surface of the substrate support WT, and an encoder head is arranged below the substrate support WT.

The position measurement system PMS may comprise an interferometer system. An interferometer system is known from, for example, U.S. Pat. No. 6,020,964, filed on Jul. 13, 1998, hereby incorporated by reference. The interferometer system may comprise a beam splitter, a mirror, a reference mirror and a sensor. A beam of radiation is split by the beam splitter into a reference beam and a measurement beam. The measurement beam propagates to the mirror and is reflected by the mirror back to the beam splitter. The reference beam propagates to the reference mirror and is reflected by the reference mirror back to the beam splitter. At the beam splitter, the measurement beam and the reference beam are combined into a combined radiation beam. The combined radiation beam is incident on the sensor. The sensor determines a phase or a frequency of the combined radiation beam. The sensor generates a signal based on the phase or the frequency. The signal is representative of a displacement of the mirror. In an embodiment, the mirror is connected to the substrate support WT. The reference mirror may be connected to the metrology frame MF. In an embodiment, the measurement beam and the reference beam are combined into a combined radiation beam by an additional optical component instead of the beam splitter.

The first positioner PM may comprise a long-stroke module and a short-stroke module. The short-stroke module is arranged to move the mask support MT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the first positioner PM is able to move the mask support MT relative to the projection system PS with a high accuracy over a large range of movement. Similarly, the second positioner PW may comprise a long-stroke module and a short-stroke module. The short-stroke module is arranged to move the substrate support WT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the second positioner PW is able to move the substrate support WT relative to the projection system PS with a high accuracy over a large range of movement.

The first positioner PM and the second positioner PW each are provided with an actuator to move respectively the mask support MT and the substrate support WT. The actuator may be a linear actuator to provide a driving force along a single axis, for example the y-axis. Multiple linear actuators may be applied to provide driving forces along multiple axis. The actuator may be a planar actuator to provide a driving force along multiple axis. For example, the planar actuator may be arranged to move the substrate support WT in 6 degrees of freedom. The actuator may be an electromagnetic actuator comprising at least one coil and at least one magnet. The actuator is arranged to move the at least one coil relative to the at least one magnet by applying an electrical current to the at least one coil. The actuator may be a moving-magnet type actuator, which has the at least one magnet coupled to the substrate support WT respectively to the mask support MT. The actuator may be a moving-coil type actuator which has the at least one coil coupled to the substrate support WT respectively to the mask support MT. The actuator may be a voice-coil actuator, a reluctance actuator, a Lorentz-actuator or a piezo-actuator, or any other suitable actuator.

Figure 3:
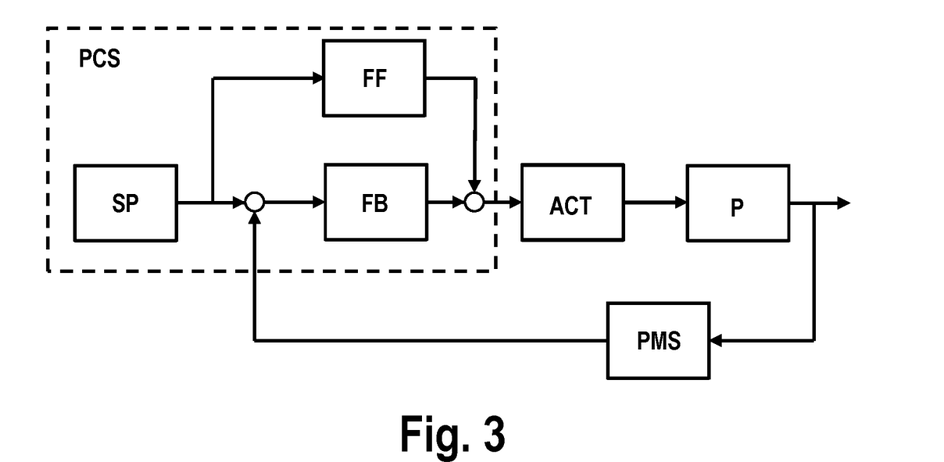
FIG. 3 schematically depicts a position control system.

The lithographic apparatus LA comprises a position control system PCS as schematically depicted in FIG. 3. The position control system PCS comprises a setpoint generator SP, a feedforward controller FF and a feedback controller FB. The position control system PCS provides a drive signal to the actuator ACT. The actuator ACT may be the actuator of the first positioner PM or the second positioner PW. The actuator ACT drives the plant P, which may comprise the substrate support WT or the mask support MT. An output of the plant P is a position quantity such as position or velocity or acceleration. The position quantity is measured with the position measurement system PMS. The position measurement system PMS generates a signal, which is a position signal representative of the position quantity of the plant P. The setpoint generator SP generates a signal, which is a reference signal representative of a desired position quantity of the plant P. For example, the reference signal represents a desired trajectory of the substrate support WT. A difference between the reference signal and the position signal forms an input for the feedback controller FB. Based on the input, the feedback controller FB provides at least part of the drive signal for the actuator ACT. The reference signal may form an input for the feedforward controller FF. Based on the input, the feedforward controller FF provides at least part of the drive signal for the actuator ACT. The feedforward FF may make use of information about dynamical characteristics of the plant P, such as mass, stiffness, damping, resonance modes and eigenfrequencies.

The manufacturing process of a semiconductor circuit as e.g. performed by a lithographic apparatus as described above requires the accurate patterning of a plurality of different layers onto a semiconductor substrate. In order to ensure proper operation of the semiconductor circuit that is created, it is required that the sequence of layers is properly aligned and that the surface of the substrate is positioned in a focal plane of the applied radiation beam, e.g. a patterned radiation beam, during the exposure process.

In order to achieve this, a substrate may be subjected to a measurement sequence or process during which a height map of the substrate is determined and during which a position of a plurality of markers, e.g. alignment markers, is determined.

In order to meet the ever increasing demands for smaller structures in semiconductor devices, there is also an ever increasing demand to have more information on the state of the substrate available prior to the exposure process. As a result, the duration of the measurement sequence that is performed prior to the exposure process tends to increase. When this happens, it may adversely affect the throughput of the lithographic apparatus, i.e. the number of substrates that can be processed per unit of time.

The present invention provides a solution for meeting the increasing demand for a more detailed measurement sequence, which does not adversely affect the throughput of the lithographic apparatus or at least has a smaller impact on the throughput than known solutions or increases the throughput.

In accordance with the present invention there is provided an inspection apparatus for inspecting an object comprising:
   a measurement system configured to measure:
      a first parameter of the object across an area of interest of the object, and
      a second parameter, different from the first parameter, of the object at a plurality of locations on the object;
   a stage apparatus configured to position the object relative to the measurement system during a measurement of the first parameter, wherein
   the measurement system is configured to measure the second parameter at the plurality of different locations during the measurement of the first parameter and wherein
   the stage apparatus is configured to position the object relative to the measurement system based on a compliance characteristic of the stage apparatus.

In general, the measurement system as applied in the present invention can be configured to measure multiple parameters at the same time or during a combined measurement sequence. By doing so, the measurements of the first parameter and the second parameter can be performed faster, compared to a measurement sequence whereby the first parameter and the second parameter are measured sequentially, i.e. a measurement sequence whereby the measurement of the first parameter is performed entire before the measurement of the second parameter. In an embodiment, the first parameter may e.g. represent a height profile of the object, whereas the second parameter may e.g. represent a position of a plurality of marks on the object. In such embodiment, the measurement system may thus be configured to determine a position of a plurality of marks on the object during a measurement of the height profile of the object.

Figure 4:
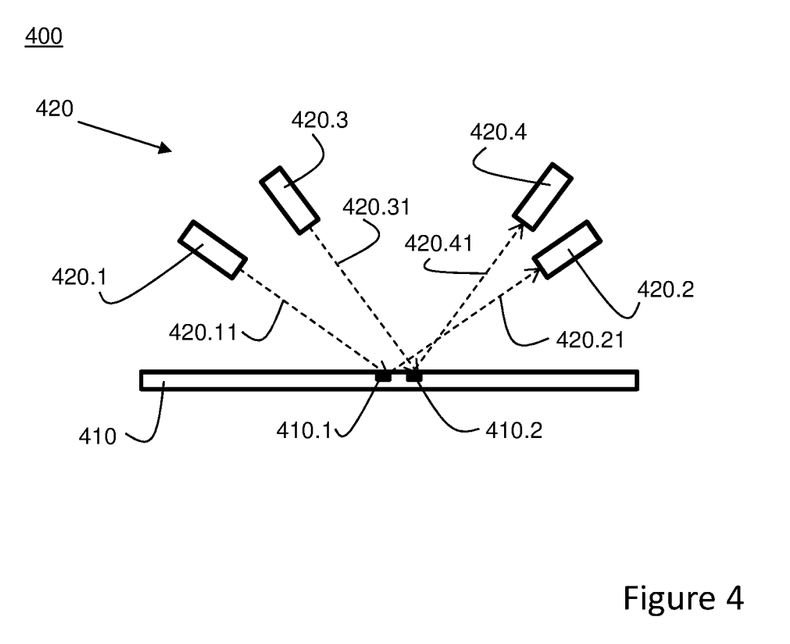
FIG. 4 depicts a measurement system as can be applied in an inspection apparatus according to the present inventions.

FIG. 4 schematically shows an embodiment of an inspection apparatus 400 according to the present invention. FIG. 4 schematically depicts an inspection apparatus 400 for inspecting an object 410, the inspection apparatus comprising a measurement system 420 for measuring different parameters or characteristics of the object 410. In the embodiment as shown the measurement system is configured to measure a first parameter of the object 410 and a second parameter of the object 410, the second parameter being different from the first parameter. In the embodiment as shown, the measurement system 420 comprises, to measure the first parameter, a radiation source 420.1 that is configured to project a first measurement beam 420.11 onto the object 410 and a detector 420.2 that is configured to receive a first reflected measurement beam 420.21, the first reflected measurement beam corresponding to a reflection of the first measurement beam 420.11 off the object 410. In the embodiment as shown, the first measurement beam 420.11 is projected onto a first point of interest 410.1 of the object 410. Within the meaning of the present invention, point of interest refers to a location on an object where a process is performed, e.g. a measurement process or inspection process or exposure process, note that such location need not be a single point but may be an area on the object, e.g. a square, circular or slit shaped area that is being inspected by a measurement beam or that is being exposed by a radiation beam. As such, in the embodiment as shown, the radiation source 420.1 and detector 420.2 are configured to measure the first parameter at the first point of interest 410.1. In the embodiment as shown, the measurement system 420 further comprises, to measure the second parameter, a radiation source 420.3 that is configured to project a second measurement beam 420.31 onto the object 410 and a detector 420.4 that is configured to receive a second reflected measurement beam 420.41, the second reflected measurement beam corresponding to a reflection of the second measurement beam 420.31 off the object 410. In the embodiment as shown, the second measurement beam 420.31 is projected onto a second point of interest 410.2 of the object 410. In order to position the object 410 relative to the measurement system 420, the object may e.g. be mounted to a stage apparatus of the inspection apparatus 400. In accordance with the present invention, as will be explained in more detail below, such positioning of the object may take account of a compliance characteristic of the stage apparatus.

It can further be pointed out that, in an embodiment of the present invention, the measurement system can be configured to measure the first parameter at a plurality of points of interest simultaneously. In such embodiment, the radiation source 420.1 and detector 420.2 may be configured to respectively project a plurality of first measurement beams 420.11 onto a plurality of points of interest simultaneously, and receive a plurality of first reflected measurement beams 420.21. In such embodiment, the plurality of points of interest may e.g. be arranged in an array, e.g. a one-dimensional array or a two-dimensional array, thus enabling a more dense or detailed determination of the first parameter across the area of interest.

With respect to the measurement system 400 as applied in an embodiment of the inspection apparatus according to the present invention, the following can further be mentioned. In embodiment as shown in FIG. 4, the measurement principle as applied for measuring the first parameter and the second parameter makes use of a radiation source and a detector configured to receive a reflected radiation beam. It can be pointed out that other measurement principles can be applied as well. In an embodiment, the first parameter as determined by the measurement system 400 includes a height or height profile of the object. In order to measure the height profile, various measurement principles can be applied, including capacitive measurements, air gauge measurements, reflective and/or refractive optical measurements, etc. In an embodiment, the second parameter as determined by the measurement system 400 includes a position of one or more marks that are located on the object 410. Determining a position of a mark can e.g. be established based on reflective and/or refractive optical measurements or image based measurements. In the embodiment as shown, the first point of interest differs from the second point of interest. In an embodiment, the first point of interest can substantially coincide with the second point of interest.

The inspection apparatus 400 according to the present invention may advantageously be used in a lithographic apparatus according to the present invention. Such a lithographic apparatus may e.g. be a dual-stage apparatus. Such an apparatus can e.g. be equipped with two stages or substrate supports which can be configured to displace and position a substrate in both an operating range of the measurement system 420 of the inspection apparatus 400 and an operating range of a projection system, e.g. a projection system PL as described above, of the lithographic apparatus. Advantageously, the measurement system 420 may be configured to determine, as the first parameter, a height profile or height map of the substrate. Such a height map may e.g. be obtained by displacing the object relative to the measurement system, e.g. relative to the measurement beam 420.11. By doing so, the measurement beam 420.11 may scan the surface of the substrate and height measurement data may be gathered by the detector 420.2 during said scanning. In an embodiment, the measurement system 420 is configured to determine the height profile or height map of the substrate, in general the object, across an area of interest of the substrate. In case of a semiconductor substrate that is to be exposed to a radiation beam, e.g. a patterned radiation beam, the area of interest where the height profile or height map is determined should preferably include the target areas that are to be exposed by the radiation beam. In general, the inspection apparatus according to the present invention may be used to perform a measurement process or an inspection process whereby two parameters are assessed during a combined measurement sequence, rather than during a sequential measurement of both parameters. In can be pointed out that the measurement process or inspection process may also be performed in parallel to an exposure process of a substrate. In particular, measurements that are performed or required during an exposure process may be corrected based on a compliance characteristic of the object table holding the substrate that is being exposed. As an example of the application of the present invention, a measurement process may be performed during which substantially the entire surface of the object may be scanned so as to obtain a height profile of substantially the entire surface of the object. In such embodiment, the measurement system 420 of the inspection apparatus 400 may further be configured to determine, as the second parameter, a position of a plurality of marks or markers that are present on the substrate. Such markers may e.g. be alignment markers which may be used to determine a location of the target areas on the substrate. Based on said location, a proper alignment of the radiation beam and the target areas can be realised during the exposure process. In an embodiment of the present invention, whereby the measurement system is configured to measure the first parameter at a plurality of points of interest simultaneously as described above, the plurality of points of interest can e.g. be arranged in an array, said array extending in a direction that is substantially perpendicular to the direction in which the object is scanned during the measurement process.

As mentioned, the measurement system as used in the inspection apparatus according to the present invention is configured to measure a first parameter of an object and is configured to measure also a second parameter during the measurement of the first parameter. Such measurement sequence whereby a second parameter is measured during the measurement of a first parameter may also be referred to as a combined measurement or a combined measurement sequence. By performing such a combined measurement or combined measurement sequence, the measurement results for the first parameter and the second parameter may become available faster than when the first parameter and the second parameter are measured sequentially, i.e. one after the other.

In general, it may occur that the required or preferred measurement conditions for measuring the first parameter may be different from the required or preferred measurement conditions for measuring the second parameter. In addition, there will typically be a trade-off between a duration of the measurement (of either the first or second parameter) and a required accuracy of the measurement. In general, one would arrange for the measurements to be performed as fast as possible, within the constraints of the required or desired accuracy.

In case the measurement of the second parameter is performed during the measurement of the first parameter, it may be desirable to take account of the required measurement conditions for both parameters.

In case the first parameter corresponds to a height map or height profile of the substrate, in general the object, it may be advantageous to displace the object 410 relative to the measurement system 420 at a constant speed or velocity, thereby scanning an area of interest of the object with a measurement beam. In order to scan the object or area of interest of the object entirely, a plurality of such scans may be needed. In order to keep the duration of the measurement of the height map as short as possible, the constant velocity at which the object is scanned is preferably selected as high as possible. In an embodiment of the present invention, whereby the measurement system is configured to measure the first parameter at a plurality of points of interest simultaneously as described above, the plurality of points of interest can e.g. be arranged in an array, said array extending in a direction that is substantially perpendicular to the direction in which the object is scanned during the measurement process.

In case the second parameter corresponds to a location of a plurality of marks on the substrate, a comparatively low speed, compared to the speed at which the height map is determined, may be required. Such a low speed may e.g. be required to obtain the required accuracy at which the location of the marks can be determined.

In order to accommodate for the different measurement conditions or requirements during the combined measurement of the first parameter and the second parameter, the measurement parameters or conditions may have to be varied during the combined measurement sequence. In particular, in case the first parameter corresponds to a height map or height profile of the substrate and the second parameter corresponds to a location of a plurality of marks on the substrate, it may be required or desirable to control the displacement, in particular the velocity, of the object relative to the measurement system 420 during the combined measurement sequence. In such embodiment it may e.g. be preferred to scan the object at a comparatively high speed when one or more points of interest are measured that do not contain a mark and to scan the object at a comparatively low speed when a point of interest is measured that does contain a mark of which the position is to be determined. In order to achieve such a position dependent velocity, the inspection apparatus according to the present invention may further comprise a stage or stage apparatus for displacing, moving or positioning the object relative to the measurement system. A position or velocity of the object relative to the measurement system may then be controlled by a suitable control unit of the stage apparatus or the inspection apparatus. Such a stage or stage apparatus may e.g. comprise a support or object table for holding the object during the measurement sequence. Such a support or object table may be similar to the supports MT or WT as described above.

Such an embodiment of the present invention is explained in more detail below, with reference to FIG. 5.

With respect to the application of a position dependent velocity during the combined measurement of a first parameter and the second parameter, it can be pointed out that the object table holding the object will typically accelerate and decelerate during the trajectory that is to be followed during the combined measurement sequence. It has been observed by the inventors that the application of such acceleration or deceleration during the measurement sequence may however adversely affect the measurement accuracy of either the first parameter or the second parameter. It has been observed that, in case the object table is accelerated or decelerated during a measurement sequence such as a combined measurement sequence described above, the object table may deform due to the acceleration or deceleration forces exerted on it. Due to this deformation, position information of the point of interest may be inaccurate, resulting in an less accurate measurement result.

Within the meaning of the present invention, a deformation of a structure such as an object table, e.g. due to forces exerted on it, may be referred as compliance. The compliance of a structure may also be considered the inverse of the mechanical stiffness of the structure. It may e.g. be expressed in nm/N, indicating the deformation of the structure, in nm, due to a force, in N, exerted on the object. In a similar manner, a structure can be considered to deform due to the application of a torque or torques. In such a case, similar compliance considerations apply. A compliance or deformation due to the application of a torque may e.g. be expressed in nm/Nm. It can be noted that the deformation may be considered relative to a reference point of the structure, e.g. a centre of gravity (CoG) of the structure or relative to the rigid body position of the considered point on the structure, e.g. the point of interest. In such case, the deformation or compliance may also represent a displacement of a particular point or location on the object relative to the CoG or rigid body position of the considered point on the structure.

In an embodiment of the present invention, the compliance of a support or object table holding an object is thus taken into account during a measurement sequence such as a combined measurement sequence whereby a second parameter is measured during the measurement of a first parameter. In such an embodiment, the inspection apparatus may further comprise a stage apparatus for displacing the object relative to the measurement system, whereby the stage apparatus is controlled by a controller or control unit which takes the compliance of the stage, e.g. of an object table of the stage, into account. Such an embodiment is schematically shown in FIG. 5.

Figure 5:
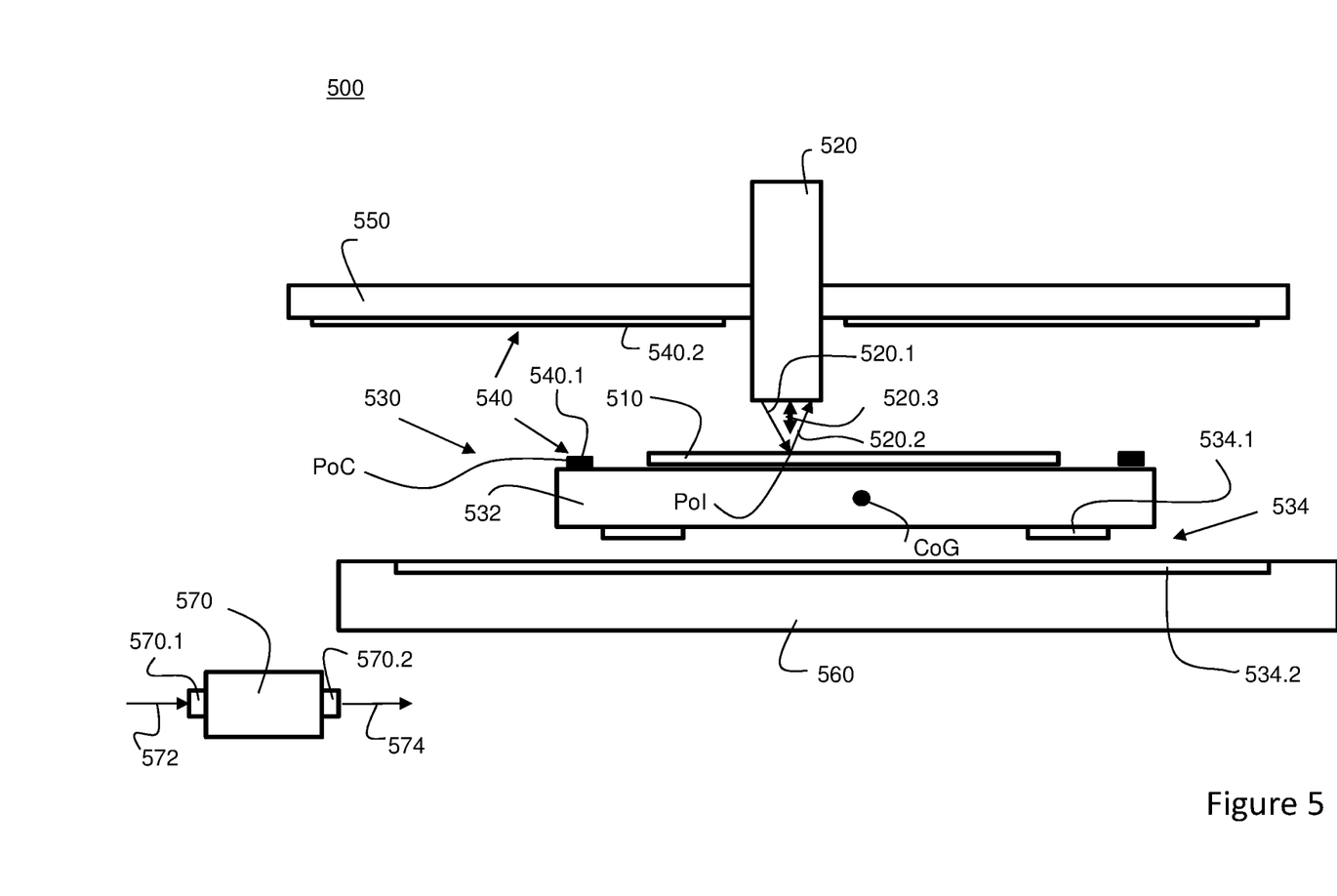
FIG. 5 depicts an inspection apparatus according to the present invention.

FIG. 5 schematically shows a further embodiment of an inspection apparatus 500 according to the present invention. The inspection apparatus 500 comprises a measurement system 520 which is configured to measure a first parameter and a second parameter of an object 510, e.g. a semiconductor substrate or wafer. In the embodiment as shown, the measurement system 520 may be configured to measure a first parameter of the object 510 and a second parameter of the object. The measurement of the first parameter may e.g. be realised by projecting a first measurement beam 520.1 onto the object 510, in particular onto a point of interest (PoI) on the object 510, and receiving a reflected measurement beam 520.2 reflected off the point of interest (PoI). In a similar manner as described above, the measurement system 520 can be configured to measure the first parameter at a plurality of points of interest simultaneously. In such embodiment, the measurement system 520 may comprise a radiation source and a detector that are configured to respectively project a plurality of first measurement beams 520.1 onto a plurality of points of interest simultaneously, and receive a plurality of reflected measurement beams 520.2 reflected off the plurality of points of interest. In such embodiment, the plurality of points of interest may e.g. be arranged in an array, e.g. a one-dimensional array or a two-dimensional array, thus enabling a more dense or detailed determination of the first parameter across the area of interest. The measurement of the second parameter may e.g. be realised by capturing an image of the object 510, in particular of the point of interest (PoI) on the object 510. The capturing of the image is schematically illustrated by the arrow 520.3.

Note that, as mentioned above, the point of interest where the first parameter is measured may be different than the point of interest where the second parameter is measured. In an embodiment of the present invention, the point of interest of the first parameter substantially coincides with the point of interest of the second parameter.

The inspection apparatus further comprises a stage apparatus 530 that is configured to displace the object 510 relative to the measurement system 520. In order to the so, the stage apparatus 530 comprises an object table or support 532 that is configured to support the object 510. The stage apparatus 530 further comprises a positioning device 534 for positioning the object table or support 532. Such a positioning device 534 may e.g. be embodied in a similar manner as the second positioner PW as described above. Such a positioning device 534 may e.g. comprise a long-stroke module and a short-stroke module. The short-stroke module is arranged to move the object table 532 holding the object 510 relative to the long-stroke module with a high accuracy over a small range of movement. Note that the short stroke module is not shown in FIG. 5. The long-stroke module is arranged to move the short-stroke module together with the object table 532 relative to the measurement system 520 with a relatively low accuracy over a large range of movement. In FIG. 5, reference numbers 534.1 and 534.2 may e.g. refer to co-operating members of a long-stroke module. Reference number 534.1 may e.g. refer to a magnet or magnet array that is configured to co-operate with a coil array 534.2 so as to displace the object table 532 over comparatively large distances. In the embodiment as shown, the coil array 534.2, e.g. a one- or two-dimensional array, is mounted to a base frame or balance mass 560. Alternatively, reference number 534.2 may e.g. refer to a magnet or magnet array, while reference number 534.1 may e.g. refer to a coil array co-operating with the magnet array 534.2. The latter arrangement may e.g. be referred to as a moving coil arrangement, whereas the former arrangement may be referred to as a moving magnet arrangement. With the combination of the long-stroke module and the short-stroke module, the positioning device 534 is able to move the object table 532 relative to the measurement system 520 with a high accuracy over a large range of movement.

The positioning device may be configured to exert forces at various location on the object table 532. The combination of said forces may be expressed or presented as a combination of a resulting force F and a resulting torque T acting on the center of gravity (CoG) of the object table.

In the embodiment as shown, the stage apparatus 530 further comprises a stage position measurement system 540 that is configured to measure a position of the object table 532 relative to a reference frame 550. In the embodiment as shown, the stage position measurement system 540 comprises a plurality of sensors 540.1 that are mounted to the object table 532 and are configured to co-operate with one or more sensor targets 540.2 that are mounted to the reference frame 550. In an embodiment, the stage position measurement system 540 can comprise an encoder based measurement system. In such embodiment, the one or more sensor targets 540.2 may comprise one or two-dimensional gratings and the sensors 540.1 may be configured to co-operate with said gratings, in order to determine a position of the object table 532 relative to the reference frame in one or more degrees of freedom (DOF). In an embodiment, the stage position measurement system 540 may be configured to determine a position or deformation of the object table 532 in six degrees of freedom (6 DOF) or even more degrees of freedom. Note that, in the embodiment as shown, the measurement system 520 is also mounted to said reference frame 550. As such, the stage position measurement system 540 can also be considered to measure a position of the object table 532 relative to a measurement system 520. In accordance with the present invention, the location or locations on the object table 532 where the position of the object table 532 is determined is referred to as the point (or points) of control (PoC). In the embodiment as shown in FIG. 5, the points of control (PoC) would thus correspond to the position of the sensors 540.1 of the stage position measurement system 540. In general, the point of control referred to may be anywhere on the object table 532. In an embodiment, the positions as measured by the sensors 540.1 may be transformed, using a transformation matrix, to a position on the object one wishes to control. This position may e.g. be the intended point where the object table 532 should be positioned, in order to perform a measurement.

The inspection apparatus 500 further comprises a control unit 570 that is configured to control the positioning device, thereby controlling a position of the object 510 relative to the measurement system. The control unit 570 may e.g. be embodied as a microcontroller, FPGA, computer, or the like. In the embodiment as shown, the control unit 570 comprises an input terminal 570.1 that is configured to receive one or more input signals 572 that may be used by the control unit to control the position of the positioning device 530. The control unit 570 further comprises an output terminal 570.2 that is configured to provide one or more control signals 574, e.g. for controlling the positioning device. In an embodiment, the control unit 570 may e.g. receive, at the input terminal 570.1, the following input signals 572:

A first input signal representing a position set point or trajectory that is to be followed by the object table 532.

A second input signal representing a measured position of the object table 532, e.g. a measurement signal obtained from the stage position measurement system 540, in particular the sensors 540.1 of the stage position measurement system 540.

Based on said input signals 572, the control unit 570 may e.g. be configured to generate control signals for controlling the force or forces as generated by the positioning device 534, in order to displace the object table 532 according to the position set point or trajectory.

A typical control loop as applied by a control unit controlling a position of an object mounted to an object table may e.g. comprise a feedback loop, whereby a control signal is generated based on a difference between the measured position of the object table and the set point, and a feedforward loop, whereby a control signal is generated based on the position set point or trajectory, in particular the required accelerations/decelerations required to obtain the position set point or trajectory.

As will be understood by the skilled person, such a typical control loop relies on the assumption that the signal or signals of the stage position measurement system 540 can be used to accurately determine the position of the point of interest PoI, i.e. the point or location on the object where the first parameter and the second parameter are measured. This assumes that the object table 532 acts or behaves as a rigid body. Phrased differently, in case of a rigid body behavior, the position of the point of interest, i.e. the location on the object 510 that is being inspection/measured/exposed, can be accurately determined based on the measurement signals of the stage position measurement system and the measured parameters, e.g. the first and second parameter can be attributed to the correct location on the object. However, in case the object table 532 would deform during the measurement process, the positional relationship between the position of the sensors (PoC) and the point of interest PoI would be different compared to the undeformed situation. As a result, the measurement results of the first and second parameter would no longer be attributed to the correct location on the object. As an example, a height map or profile of the object would no longer associate a measured height to the correct location on the object.

In order to mitigate or alleviate this effect, the present invention provides, in an embodiment, an inspection apparatus having a control unit for controlling a positioning device of the apparatus, whereby the control unit is configured to control the position device based on a compliance of an object table holding an object. As mentioned above, the compliance of a structure or object table refers to a deformation of a structure due to the application of a force or forces and torques on the structure.

The deformation or compliance of a structure may e.g. be expressed in nm/N and indicates in general the deformation in nm between two points on the structure, when a certain force is applied to the structure. The compliance can be considered the inverse of the mechanical stiffness of a structure. The compliance of a structure may e.g. be derived from finite element models of the structure. By means of finite element modeling or similar techniques, one can thus determine or approximate a compliance of a structure such as an object table. In case an object such as a substrate is clamped on the object table, it can e.g. be assumed that the object deforms together with the object table. In such case, one can thus determine the compliance of a point of interest on an object 510 of the object table as a function of the applied force or forces to the object table. Similarly, one can also determine the compliance of a point of control of the object table as a function of the applied force or forces to the object table. The compliance of an object table may also be expressed as a deformation or displacement of a point on the object table, e.g. a point of interest or point of control, relative to a reference point, e.g. a location on the object table where a force is applied, or a center of gravity of the object table or a rigid body location of the considered point.

It can also be mentioned that in general, the compliance of an object table, or a structure in general, will also depend on the location and direction where the force is applied. In addition, the compliance will in general also depend on the position of the point of interest. In this respect, it can be noted that the point of interest, i.e. the location on the object where a measurement is actually performed, will displace during a measurement sequence. The distance between the point of interest and the location where a force is applied will thus change as well, and, as a result of this, the compliance as well. This is e.g. illustrated in FIG. 6.

Figure 6:
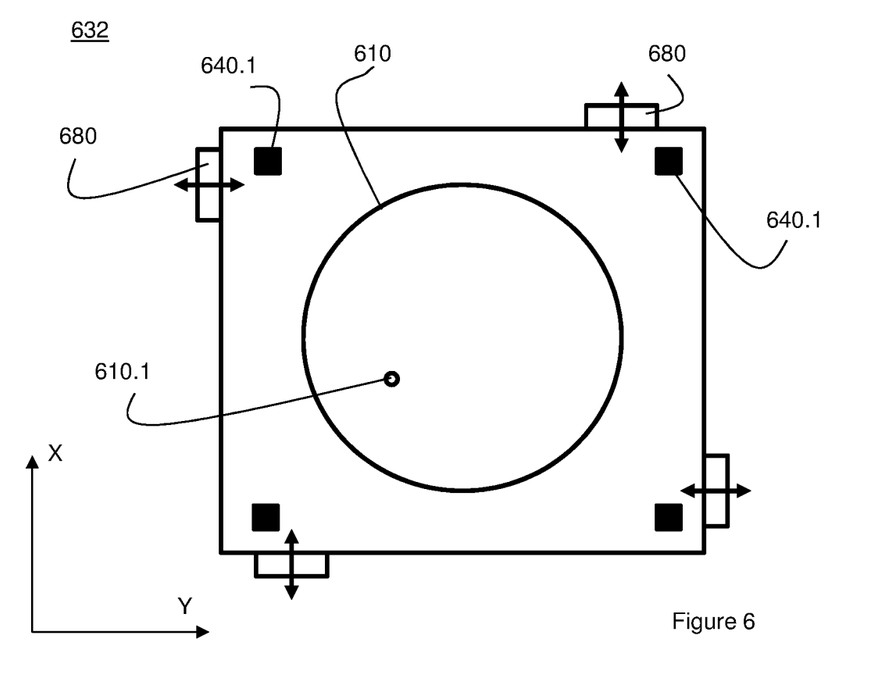
FIG. 6 depicts a top view of an object table as can be applied in the present invention.

FIG. 6 schematically shows a top view of an object table 632 that is configured to hold an object 610, e.g. a semiconductor substrate. In the embodiment as shown, the object table is provide with 4 actuators 680 configured to exert force on the object table 632 along the directions as indicated by the arrows. The object table 632 further comprises 4 position sensors 640.1 configured to measure a position of the object table 632 relative to a measurement system (not shown) that is configured to measure a parameter or characteristic of the object 610 at location 610.1, also referred to as the point of interest PoI of the object 610. When forces are exerted on the object table 632, the object table will, due to the compliance of the object table, deform, resulting in a displacement of the sensors 640.1 relative to their nominal or undeformed position. In a similar manner, the point of interest location 610.1 will change, due to the deformation. In general, the deformation or displacement of a particular location, e.g. a location of a sensor or the location of the point of interest, will depend on the distance between the location and the location at which the force is applied. When the distance between the force application location and the location of the sensor or point of interest is small, the deformation will be small as well. In the embodiment as shown, the distance between the sensors 640.1 and the force application locations, i.e. the locations of the actuators 680 is substantially fixed. In the embodiment as shown, the impact of the forces exerted by the 4 actuators on the displacement of a particular sensor can thus be considered independent of the position of the object table 632. For the point of interest 610.1 however, the impact of the forces will depend on the position of the object table 632 as this position determines how close or remote the point of interest is to the different force application locations. In this respect it can be pointed out that, in case the measurement system is configured to perform measurements at a plurality of points of interest simultaneously, the impact of forces or torques will be different for the different points of interest.

Figure 7:
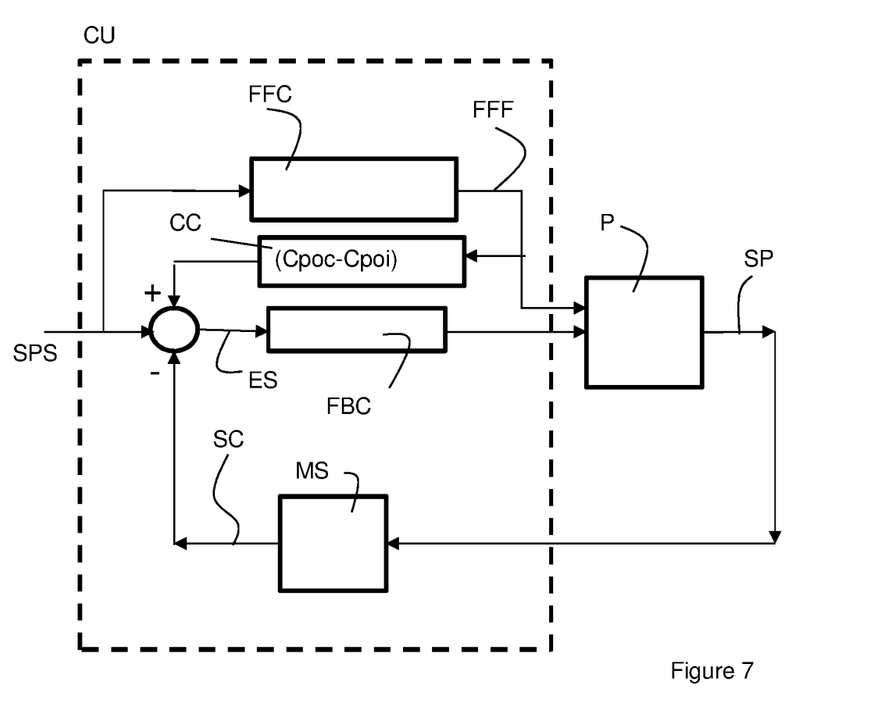
FIG. 7 depicts a control scheme as can be applied by an inspection apparatus according to the invention.

In an embodiment, the inspection apparatus according to the present invention comprises a stage apparatus for displacing the object relative to the measurement system, the stage apparatus comprising a control unit that is configured to apply a control scheme that takes a compliance of the stage apparatus into account. FIG. 7 schematically shows such a control scheme for controlling a stage apparatus of an inspection apparatus according to the present invention. The control scheme schematically shows a control unit CU as can be applied in the present invention. In the arrangement as shown, the control unit CU comprises a feedforward controller FFC and a feedback controller FBC. In the embodiment as shown, the control unit CU is configured to receive, as an input, a set point signal SPS, the set point signal SPS representing a trajectory to be followed by a point of interest on the object. In the embodiment as shown, the feedforward controller FFC is configured to determine, based on the set point signal SPS, a feedforward force that is to be generated by the positioning device of the stage apparatus. In an embodiment of the present invention, the feedforward controller is configured to generate a feedforward force which takes account of the compliance of the stage apparatus, e.g. a compliance of an object table holding the object that is to follow the trajectory of the point of interest. As an example of such a feedforward controller, a snap feedforward controller can be mentioned. Such a controller is e.g. known from WO2015/185301, incorporated herein by reference. Based on the set point signal, the feedforward controller may be configured to generate a required feedforward force FFF as:

$$FFF = FF1 + FF2,$$

$$FF1 = m * s^{\wedge}2 * SPS,$$

$$FF2 = -m^2 * s^{\wedge}4 * SPS * cpoi. \quad (1)$$

Wherein: m=the mass that is to be driven;
s=the complex argument of the Laplace transformation;
s^2*SPS thus representing the required acceleration derived from the set point signal and s^4*SPS thus represents the required snap value derived from the set point signal
cpoi=the compliance of the point of interest.

Equation (1) may be generalized to a matrix equation whereby FFF represent a feedforward vector representing the required feedforward forces and SPS represents a set point vector. In such case FFF may be determined as:

$$FFF=FF1+FF2,$$

$$FF1=M*s^2*SPS,$$

$$FF2=-M*Cpoi*M*s^4*SPS \quad (2)$$

Wherein: M=the mass matrix that is to be driven;
s=the complex argument of the Laplace transformation;
s^2*SPS thus representing the required acceleration derived from the set point signal and $s^4$*SPS thus represents the required snap value derived from the set point signal
Cpoi=the compliance matrix of the point of interest.

By taking account of the compliance, a more accurate positioning of the point of interest is expected to occur, i.e. the actual position of the point of interest is expected to better follow the desired trajectory described by the SPS. In the control scheme shown in FIG. 7, block P represents the physical stage apparatus of the inspection apparatus according to the invention. Block P can thus be considered to convert the applied forces to the stage apparatus, i.e. the forces applied to the object table of the stage apparatus, to a position of the stage apparatus, as e.g. measured by the stage position measurement system of the stage apparatus. Output signal SP of block P may thus represent the output signals as generated by the stage position measurement system, e.g. output signals of one or more sensors mounted to the object table.

Typically, the output signals of the stage position measurement system are used as feedback for the control system or control unit of the stage apparatus of the inspection apparatus. In case the stage apparatus, in particular the object table, can be considered to behave as a rigid body, the sensor signals SP of the stage position measurement system could readily be applied to derive the position of the point of interest. In the control scheme shown in FIG. 7, block MS represents a conversion of the sensor signal SP of the stage position measurement system to a position of the point of interest.

Due to the compliance of the object table of the stage apparatus, the sensor signal or signals SP cannot readily be converted to a position of the point of interest. In an embodiment of the present invention, the compliance of the object table is further taken into account in determining a position of the point of interest, i.e. a position at which the measurement system of the inspection apparatus according to the invention measures a parameter of the object that is inspected. In the embodiment as shown, the sensor signal SP as obtained from the stage position measurement system is converted by block MS to a position SC of the point of interest. However, due to the compliance of both the point of interest and the point of control, the position SC does not accurately expresses the actual position of the point of interest. In the embodiment as shown, the effect of both the compliance of the point of interest and the point of control is determined as a compliance correction CC, based on the determined feedforward force FFF. By doing so, a more accurate point of interest position, i.e. corrected for both the compliance of the point of interest and the point of control is obtained and applied as feedback to the feedback controller FBC. More specifically, in the embodiment as shown, the feedback controller FBC receives an error signal ES representing a difference between a desired position of the point of interest and a measured or determined position of the point of interest.

The error signal ES as applied by the feedback controller FBC can thus be expressed as:

$$ES=SPS-MS*SP+(Cpoc-Cpoi)*FFF, \text{ or}$$

$$ES=SPS-SC+(Cpoc-Cpoi)*FFF \quad (3)$$

In equation (3), SC—(Cpoc−Cpoi)*FFF may thus be considered the position of the point of interest, corrected for both the compliance of the point of control and the point of interest. This compliance corrected position of the point of interest may thus be used as the actual location at which the measurement system of the inspection apparatus is actually measuring the first parameter and/or the second parameter. In this respect it can be pointed out that, in case the measurement system is configured to perform measurements at a plurality of points of interest simultaneously, the compliant corrected position needs to be determined for each of the plurality of points of interest that are measured.

The proposed control scheme, as e.g. shown in FIG. 7, thus enables an inspection apparatus to accurately measure a parameter or characteristic of an object, across an area of interest, even when the object is subjected to accelerations or decelerations during the measurement sequence. This has been demonstrated by the inventors by means of simulations.

In particular, a measurement sequence of a semiconductor substrate was simulated, whereby a height map of the substrate and a position of a plurality of marks on the substrate where to be determined. In the simulation, the measurement of the height map was performed at a comparatively high speed, whereas the position measurement of the marks was performed at a low speed. The object table holding the substrate was therefore alternatingly subjected to deceleration and acceleration forces, when a position measurement of a mark was to be performed. A processing of the simulation results, in particular the processing of the point of interest location taking account of the compliance as described above, resulted in a height map that substantially corresponded to a height map as generated when the object table is not subjected to acceleration or deceleration forces.

The present invention thus enables a fast and reliable manner of determining two parameters of an object during a combined measurement sequence.

Advantageously, the parameters may e.g. be a height map of a semiconductor substrate, as a first parameter, and a position of a plurality of marks on the substrate, as the second parameter. It can however be pointed out that other parameter combinations may be considered as well.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. An inspection apparatus configured to measure:
   a first parameter of an object across an area of interest of the object; and
   a second parameter, different from the first parameter, of the object at a plurality of different locations on the object, wherein the inspection apparatus comprises:
   a stage apparatus configured to position the object during a measurement of the first parameter,
   wherein the inspection apparatus is configured to measure the second parameter at the plurality of different locations during the measurement of the first parameter,
   wherein the stage apparatus is configured to position the object based on a compliance characteristic of the stage apparatus,
   wherein the stage apparatus comprises a control system, and
   wherein the control system is configured to move the object at a first non-zero velocity during the measurement of the first parameter and at a second non-zero velocity, different from the first non-zero velocity, during the measurement of the second parameter.

2. The inspection apparatus of claim 1, wherein the stage apparatus comprises:
   an object table configured to hold the object;
   a stage position measurement system configured to generate a stage position signal representative of a position of the object table; and
   a positioning device configured to exert a force on the object table to displace the object table,
   wherein the control system is configured to control the positioning device based on the stage position signal, the control system further being configured to control the positioning device based on a compliance characteristic of the object table.

3. The inspection apparatus of claim 1, wherein the object comprises a substrate.

4. The inspection apparatus of claim 3, wherein the area of interest includes a plurality of target areas that are to be exposed by a radiation beam during an exposure process.

5. The inspection apparatus of claim 3, wherein the substrate comprises a plurality of marks respectively disposed at the plurality of locations.

6. The inspection apparatus of claim 5, wherein:
   the first parameter of the object comprises a height profile of the area of interest, and
   the second parameter comprises a position of the plurality of marks.

7. The inspection apparatus of claim 1, wherein the control system is configured to receive a set point signal representative of a trajectory of the object.

8. The inspection apparatus of claim 7, wherein the trajectory represents a desired position of the object.

9. The inspection apparatus of claim 8, wherein the control system is configured to generate a force signal representing a required force for a positioning device, the force signal being based on the set point signal and a compliance characteristic of an object table.

10. The inspection apparatus of claim 9, wherein a stage position measurement system comprises one or more sensors configured to cooperate with one or more sensor targets to generate the stage position signal.

11. The inspection apparatus of claim 10, wherein the inspection apparatus is configured to measure the first parameter at a first point of interest of the object and is configured to measure the second parameter at a second point of interest of the object.

12. The inspection apparatus of claim 11, wherein the first point of interest and the second point of interest substantially coincide.

13. The inspection apparatus of claim 11, wherein:
   the one or more sensors are mounted to the stage, and
   the compliance characteristic represents a deformation and/or displacement of the one or more sensors relative to a reference.

14. The inspection apparatus of claim 13, wherein the compliance characteristic further represents a deformation and/or displacement of a point of interest relative to the reference.

15. The inspection apparatus of claim 14, wherein the compliance characteristic represents a deformation due to the force exerted on the object table.

16. The inspection apparatus of claim 10, wherein the inspection apparatus is configured to measure the first parameter at a plurality of points of interest of the object simultaneously and is configured to measure the second parameter at a second point of interest of the object.

17. The inspection apparatus of claim 16, wherein the second point of interest and one of the plurality of points of interest substantially coincide.

18. The inspection apparatus of claim 16, wherein:
the plurality of points of interest are arranged in an array extending in a first direction,
the inspection apparatus is configured to measure the first parameter of the object by scanning the area of interest in a second direction, and
the second direction is substantially perpendicular to the first direction.

19. The inspection apparatus of claim 1, wherein the control system is configured to move the object at the first non-zero velocity during the measurement of the first parameter at a first point of interest and at the second non-zero velocity during the measurement of the second parameter at a second point of interest; and
wherein the first parameter is not measured at the second point of interest.

20. A lithographic apparatus comprising an inspection apparatus for inspecting an object configured to measure:
a first parameter of the object across an area of interest of the object; and
a second parameter, different from the first parameter, of the object at a plurality of different locations on the object; and
a stage apparatus configured to position the object during a measurement of the first parameter,
wherein the inspection apparatus is configured to measure the second parameter at the plurality of different locations during the measurement of the first parameter,
wherein the stage apparatus is configured to position the object based on a compliance characteristic of the stage apparatus,
wherein the stage apparatus comprises a control system, and
wherein the control system is configured to move the object at a first non-zero velocity during the measurement of the first parameter and at a second non-zero velocity, different from the first non-zero velocity, during the measurement of the second parameter.

21. The lithographic apparatus of claim 20, wherein:
the first parameter of the object comprises a height profile of the area of interest, and
the second parameter comprises a position of a plurality of marks.

* * * * *

UNITED STATES PATENT AND TRADEMARK OFFICE
CERTIFICATE OF CORRECTION

| | |
|---|---|
| PATENT NO. | : 11,914,307 B2 |
| APPLICATION NO. | : 17/433897 |
| DATED | : February 27, 2024 |
| INVENTOR(S) | : Roset et al. |

Page 1 of 1

It is certified that error appears in the above-identified patent and that said Letters Patent is hereby corrected as shown below:

On the Title Page

Item (54) and in the Specification Column 1, Line 1, delete "INSPECTION APPARATUS LITHOGRAPHIC APPARATUS MEASUREMENT METHOD" and replace with --INSPECTION APPARATUS, LITHOGRAPHIC APPARATUS, MEASUREMENT METHOD--.

Signed and Sealed this
Ninth Day of April, 2024

*Katherine Kelly Vidal*

Katherine Kelly Vidal
*Director of the United States Patent and Trademark Office*